United States Patent
Carlsson et al.

(10) Patent No.: US 10,838,112 B2
(45) Date of Patent: Nov. 17, 2020

(54) METHOD FOR MANUFACTURING A LIGHT EXTRACTION STRUCTURE FOR A UV LAMP

(71) Applicant: Lightlab Sweden AB, Uppsala (SE)

(72) Inventors: Jan-Otto Carlsson, Uppsala (SE); Olesya Nikonova, Uppsala (SE)

(73) Assignee: Lightlab Sweden AB, Uppsala (SE)

( * ) Notice: Subject to any disclaimer, the term of this patent is extended or adjusted under 35 U.S.C. 154(b) by 161 days.

(21) Appl. No.: 16/302,451

(22) PCT Filed: May 22, 2017

(86) PCT No.: PCT/SE2017/050541
§ 371 (c)(1),
(2) Date: Nov. 16, 2018

(87) PCT Pub. No.: WO2017/204728
PCT Pub. Date: Nov. 30, 2017

(65) Prior Publication Data
US 2019/0204476 A1      Jul. 4, 2019

(30) Foreign Application Priority Data
May 23, 2016  (SE) ...................................... 1650708

(51) Int. Cl.
*G02B 27/00* (2006.01)
*G02B 1/11* (2015.01)
(Continued)

(52) U.S. Cl.
CPC ............ *G02B 1/11* (2013.01); *C23C 18/1204* (2013.01); *C23C 18/1208* (2013.01);
(Continued)

(58) Field of Classification Search
CPC ... G02B 1/00; G02B 1/10; G02B 1/11; G02B 5/28; G02B 5/283; G02B 5/285;
(Continued)

(56) References Cited

U.S. PATENT DOCUMENTS 7,575,735 B2 *   8/2009   Wong ........................ C30B 7/14
                                                              423/593.1
9,915,761 B2 *   3/2018   Ishizawa ............... C03C 17/007
(Continued)

FOREIGN PATENT DOCUMENTS

EP       0887104 A1    12/1998
JP    2015206019 A    11/2015

OTHER PUBLICATIONS

Extended European Search Report dated Nov. 13, 2019 for EP Application No. 17803169.6, 69 pages.
(Continued)

*Primary Examiner* — Arnel C Lavarias
(74) *Attorney, Agent, or Firm* — RMCK Law Group, PLC

(57) ABSTRACT

A method for forming a light extraction layer including nanostructures, the method including: providing a substrate, the substrate being at least partially transparent to UV light; forming a non-aqueous precursor solution comprising fluorine and an alkaline earth metal to form alkaline earth metal difluoride particles; applying the precursor solution on at least a first side of the substrate; drying the substrate at a first temperature for a first period of time; and baking the substrate at a second temperature, higher than the first temperature, for a second period of time, thereby forming a light extraction nanostructure layer comprising alkaline earth metal difluoride nanostructures on the substrate. Also, a light extraction structure and to a UV lamp including such an extraction structure.

21 Claims, 4 Drawing Sheets

(51) Int. Cl.

| | |
|---|---|
| *H01J 61/35* | (2006.01) |
| *C23C 18/12* | (2006.01) |
| *H01J 61/40* | (2006.01) |
| *H01J 63/04* | (2006.01) |
| *H01J 61/34* | (2006.01) |
| *H01J 9/20* | (2006.01) |
| *F21V 8/00* | (2006.01) |
| *H01L 33/46* | (2010.01) |
| *H01L 33/44* | (2010.01) |

(52) U.S. Cl.
CPC ...... *C23C 18/1245* (2013.01); *C23C 18/1254* (2013.01); *C23C 18/1283* (2013.01); *G02B 6/001* (2013.01); *G02B 6/0043* (2013.01); *H01J 9/20* (2013.01); *H01J 9/205* (2013.01); *H01J 61/34* (2013.01); *H01J 61/35* (2013.01); *H01J 61/40* (2013.01); *H01J 63/04* (2013.01); *H01L 33/46* (2013.01); *H01L 33/44* (2013.01)

(58) Field of Classification Search
CPC ......... C23C 18/00; C23C 18/08; C23C 18/12; C23C 18/1204; C23C 18/1216; C23C 18/1229; C23C 18/1245; C23C 18/125; C23C 18/1254; C23C 18/1262; C23C 18/1283; C23C 18/1291
USPC ....... 359/601, 609, 577, 580, 581, 582, 586, 359/588, 589, 590; 516/20, 31, 33; 977/700, 723, 762, 773, 810, 832, 834, 977/902, 932, 963
See application file for complete search history.

(56) References Cited

U.S. PATENT DOCUMENTS

| | | |
|---|---|---|
| 2007/0284565 A1 | 12/2007 | Leatherdale et al. |
| 2011/0027577 A1 | 2/2011 | Tanaka et al. |
| 2012/0210749 A1 | 8/2012 | Feng et al. |
| 2012/0228601 A1 | 9/2012 | Hiyama et al. |
| 2013/0034722 A1 | 2/2013 | Kalyankar et al. |
| 2014/0147594 A1 | 5/2014 | Jewhurst et al. |
| 2014/0170049 A1 | 6/2014 | Ding et al. |
| 2014/0178657 A1 | 6/2014 | Jewhurst et al. |
| 2015/0271905 A1 | 9/2015 | Oh et al. |
| 2018/0269022 A1* | 9/2018 | Tiren; Jonas ........... H01J 61/40 |

OTHER PUBLICATIONS

Fujihara, S. et al., "Controlling Factors for the Conversion of Trifluoroacetate Sols into Thin Metal Fluoride Coatings," Journal of Sol-Gel Science and Technology, vol. 19, pp. 311-314, 2000.

Fujihara, S. et al., "Preparation and characterization of MgF2 thin film by a trifluoroacetic acid method," Thin Solid Films, vol. 304, pp. 252-255, 1997.

Tada, M. et al., "Sol-gel processing and characterization of alkaline earth and rare-earth fluoride thin films," J. Mater. Res., vol. 14, No. 4, pp. 1610-1616, Apr. 1999.

International Search Report and Written Opinion dated Sep. 14, 2017 for PCT International Application No. PCT SE2017/050541, 14 pages.

Swedish Search Report dated Feb. 2, 2017 for Swedish Patent Application No. 1650708-9, 3 pages.

* cited by examiner

METHOD FOR MANUFACTURING A LIGHT EXTRACTION STRUCTURE FOR A UV LAMP

CROSS-REFERENCE TO RELATED APPLICATIONS

This application is a 371 U.S. National Stage of International Application No. PCT/SE2017/050541, filed May 22, 2017, which claims priority to Swedish Application No. 1650708-9, filed on May 23, 2016. The disclosures of each of the above applications are incorporated herein by reference in their entirety.

TECHNICAL FIELD

The present invention generally relates to a method for forming a light extraction structure for a UV lighting element. The present invention also relates to such a light extraction structure.

BACKGROUND OF THE INVENTION

Ultraviolet (UV) emitting lamps are used in numerous applications. They are for example used for curing of resins (glues), for tanning, for disinfection, for fluorescence (in itself a field with many applications) and many more. These applications are wide spread. In practice, UV lamps covering a range from 180-400 nm generally uses UV light sources based on mercury (Hg) vapor, so called low pressure (LP), medium pressure (MP) and high pressure (HP) lamps, but other types are available such as for example Excimer light sources.

Light sources based on Light Emitting Diode (LED) and Field Emission Lamp (FEL) technology are emerging as alternatives. The main advantages with these technologies are, that they are completely free of mercury, well known as being environmentally dangerous, and that they turn on instantly (within milliseconds) something for example LP Hg light sources tend not to do.

In forming a UV lamp, at least one of the above mentioned light sources are enclosed by an enclosing structure, the enclosing structure typically comprising a material that is transparent to UV light emitted by the UV light source. Many times, the UV lamp is also covered by an additional protective structure, again made of a material that is transparent to the desired wavelengths. A common material used, especially for wavelengths between 200 and 300 nm (in principle the UVC+UVB regions), is quartz, although a few other materials can be used as well. This wavelength range is especially interesting for germicidal (disinfecting) applications since bacteria and other organisms generally are affected in this region but not to any significant extent by higher wavelengths. Other applications are for example disinfection of air, sterilization of medical tools and surgery theaters, curing of resins, tanning etc.

Energy effectiveness is important for environmental reasons, lamp cost and lamp life time. For germicidal applications, the UVC energy delivered to the medium that shall be disinfected, is in principle determining to what extent the living bacteria are reduced. Thus for a water purification application, the UVC wattage and the flow of the medium together, will determine to what extent the disinfections performed. In the case of a fixed volume being treated, the wattage and time will determine the same. Typical ranges in practice is to reduce the number of living organisms in the order of 1:10 000 to 1:10 000 000.

Larger disinfection systems may use several kilowatts to operate the large volume flows (usually of water). In these systems it is obvious that saving energy, i.e. improving the efficiency, becomes important. For smaller systems, such improvements may predominantly be used to lower the system cost (i.e. by using smaller lamps to reach the desired effect).

A problem facing currently available UV lamps is the light extraction efficiency of the enclosing glass structure(s) of the lamps. The light extraction efficiency of the UV lamp may be defined as the ratio between the energy of the light that has escaped outside the lamp and the energy of the light generated inside the lamp (or LED). The light extraction efficiency of the UV lamp is always less than unity (one), i.e., portions of the light generated "inside" the UV lamp never reaches the external environment.

With an urge to improve the energy efficiency of the UV lamp, there is thus a great need to supply a solution to enhance the effectiveness for UV lamps by providing an effective light extracting technology which may be manufactured and implemented easily and cost effectively. Such a solution may help to improve performance and save energy for many UV applications.

Some attempts to enhance the visible light output from lamps are known. For example, a method is known wherein particles of silica are immersed into a binder solution, which is subsequently applied, dried and annealed. In this way a particulate composite is obtained. The method has several drawbacks. First of all, such ready-made particles will usually have a wide distribution in size. A typical deviation from the average diameter may be +300%/−75%. Such large deviations will cause problems both in the process as well as the performance of the composite as a light extraction layer. Another significant problem in this kind of approach is that is becomes very difficult to make sure that the immersed particles are distributed in a uniform way both in the binder solution and finally on the surface of a substrate on which the solution is applied. The particles are also likely to form aggregates. The result is inevitably a resulting layer that lacks in uniformity both in distribution as well as being aggregated to larger structures and containing a large spread in particle size.

SUMMARY OF THE INVENTION

According to an aspect of the invention, the above is at least partly alleviated by a method for forming a light extraction layer comprising nanostructures, the method comprising: providing a substrate, the substrate being at least partially transparent to UV light; forming a non-aqueous precursor solution comprising fluorine and an alkaline earth metal to form alkaline earth metal difluoride particles; applying the precursor solution on at least a first side of the substrate; drying the substrate at a first temperature for a first period of time; and baking the substrate at a second temperature, higher than the first temperature, for a second period of time, thereby forming a light extraction nanostructure layer comprising alkaline earth metal difluoride nanostructures on the substrate.

The present invention is based on the realization that metal difluoride nanostructures such as nanograins can be used to form an effective light extraction layer also for UV. Accordingly, a method for forming such a light extraction layer is provided. Moreover, the described method makes it possible to form a light extraction layer on substrates of varying type and shape. In practice, it is desirable to be able to coat a substrate such as a glass sleeve, window or similar as well as lamp envelopes in a way that is fast, reliable and inexpensive, which is enabled by the described method.

According to one embodiment of the invention, forming the non-aqueous precursor solution comprises using a sol-gel process.

A sol-gel synthesis technique is highly attractive to fabricate structures for enhancement of light extraction. In particular, non-aqueous sol-gel processing of materials is a wet-chemical technique to fabricate materials of unique structures and properties. It means basically a stepwise exchange of precursor ligands thereby opening for a favorable reaction channel for formation of a colloidal suspension—a sol—and gelation of the sol to form a network in a continuous liquid phase. After applying the sol or gel on a surface and a subsequent heat treatment cycle, different materials can be prepared. The chemical composition and the structure of the final material are controlled by the sol/gel composition, solution structures and by the heat treatment procedures, respectively. The sol-gel technique is a versatile, inexpensive and scalable technique suitable for many demanding application areas like for instance enhancement of light extraction from a UV source.

The described sol-gel process can be compared to known techniques commonly involving water ($H_2O$) as a critical component. The use of water has two main disadvantages. Firstly, the resulting nanostructures will exhibit large deviation in size as well as difficulties in obtaining a uniform layer. Secondly, when water is present the desired stoichiometric fluoride (without oxygen contamination) cannot be obtained, which in turn will influence the behavior and properties of the layer in a negative manner.

Accordingly, sol-gel based layers will exhibit uniform and effective light extraction layers by applying a two-step, non-aqueous sol-gel process.

In the present invention a non-aqueous precursor solution is produced in a non-aqueous process and may comprise: forming a mixture comprising a solvent and an alkaline earth metal; boiling the mixture with reflux forming a gel; evaporating the solvent of the gel; cooling down the gel adding a solvent to the gel; heating the solvent with gel; when the boiling point of the solvent with gel is reached, adding a compound comprising Fluorine; and boiling the gel such that a transparent sol comprising of alkaline earth metal difluoride nanoparticles is formed. The compound comprising Fluorine may be Trifluoroacetic acid, $CF_3CO_2H$, and the alkaline earth metal may be at least one of Mg, Ca, Ba and Sr such that the resulting nanostructures comprise at least one of $MgF_2$, $CaF_2$, $BaF_2$ and $SrF_2$ which are all highly transmissive in the UV wavelength region.

According to one embodiment of the invention, the step of boiling with reflux may be performed for a time period in the range of 5 min to 1 h.

Once the precursor solution is formed it may be applied on the substrate using dip coating, spray coating or spin coating, depending on what is most suitable for a specific substrate. For example, for a substrate having a non-planar or irregular shape, spin coating may not be possible and dip coating may instead be an attractive alternative.

As an example, in one embodiment of the invention the substrate may be a tubular structure and applying the treated precursor solution to the substrate may thus comprise dip coating of the tubular structure to form a light extraction layer on the inside and outside of the tubular structure.

After applying the precursor solution on the substrate the final nanostructures are obtained in subsequent drying and heat treatment processes.

According to one embodiment, the first temperature may be in the range of 50 to 150° C. and the first period of time may be in the range of 10 s to 5 min, thereby describing the drying of the substrate after the precursor solution has been applied to the substrate.

In one embodiment of the invention, the second temperature is in the range of 200 to 400° C. and the second period of time is 1 min to 1 h, thereby describing the baking of the substrate to form the light extraction layer.

As an example, in one embodiment of the invention the substrate may be a tubular structure and applying the treated precursor solution to the substrate may thus comprise dip coating of the tubular structure to form a light extraction layer on the inside and outside of the tubular structure.

In one embodiment of the invention, the nanostructures may be nanograins. In general, a nanograin can be considered to have an ordered arrangement of atoms throughout the grain, i.e. a grain can be considered to be crystalline while a nanoparticle might be crystalline, poly-crystalline or amorphous or a mix thereof. However, the nanostructures according to the invention may in some instances be referred to as e.g. nanorods, nanowires, nanotubes, nanopenciles, nanospikes, nanoneedles and nanofibres. The nanostructures may also be agglomerates or the like.

Furthermore, the method may comprise applying a plurality of light extraction layers on the substrate in order to achieve in improved surface coverage and/or to provide a thicker light extraction layer.

According to one embodiment of the invention, an average separation distance between nanostructures is in the range of 1 to 100 nm.

According to one embodiment of the invention, the plurality of nanostructures may be grains arranged in a poly-crystalline layer.

According to a second aspect of the invention, there is provided a light extraction structure comprising a light extraction layer formed by the method according to any one of the above described embodiments, the light extraction structure comprising: a substrate at least partly transparent to UV light, the substrate having a first and a second side, the first side of the substrate arranged to face the UV light source and to receive UV light emitted by the UV light source; and a light extraction layer arranged on at least one of the first and the second side of the substrate, the light extraction layer being configured to reduce an amount of UV light reflected by the substrate.

For light passing through a substrate with a higher refractive index $n_1$ into a medium with a lower refractive index $n_2$ the light is refracted according to Snell's law:

$$n_1 \sin \theta_1 = n_2 \sin \theta_2$$

If the angle of incidence $\theta_1$ is larger than the critical angle $\theta_c$ total reflection will occur. The critical angle is given by $$\theta_c = \sin^{-1} \frac{n_2}{n_1}$$

Therefore, photons that are incident on the surface with an angle larger than the critical angle, are all reflected and are either entering the lamp inwards again and may keep being reflected, thus being trapped inside the lamp. Secondly they may enter the glass envelope of the lamp, but will be reflected when impacting the outer glass wall and may be trapped inside the glass until they have lost the energy by e.g. absorption to the glass material. This means that in a three dimensional aspect there is a cone (commonly referred to as the light cone) in which incident light will escape.

Also for angles lower than the critical angle, portions of the incident light are still reflected. The reflectivity and the transmissivity are described by the Fresnel equations. Without going into details, the Fresnel equations describe the reflective and transmissive portions of S-polarized and P-polarized components of the electrical fields (denoting polarization perpendicular and parallel to the plane of the incident light wave, respectively).

Antireflective coatings for visible light have been known for many decades. These kinds of layers form a stepwise adoption of the refractive indices between the transparent material and its surrounding materials (air, gas, water, etc.) and in principle will act by widening the effective critical angle and reduce the amount of light that is reflected and trapped and thus increase the throughput.

In accordance to the invention, enhanced light output is achieved by providing a light extraction structure comprising a light extraction layer comprising nanostructures manufactured as described above.

The nanostructures differ from the antireflective coatings in that they, in one embodiment, may also consist of separated nanostructures (thus not a continuous layer or film) and in that the nanostructures are very small, for example in the range of 1-200 nm. These nanostructures may rely on increased scattering (e.g., via creating electromagnetic and plasmonic resonances). However, when going to such nanostructures the above classical models may not be enough, analytical models are not available and advanced computer simulations are used to study the effects. Typically such advanced models for light-extraction efficiency in the UV region use the finite-difference time-domain (FDTD) techniques to solve the Maxwell equations in the devices.

The exact target geometry of the nanostructures is depending on the substrate material, the medium outside the lamp and the desired wavelength that should be amplified to an optimum. The nanostructures can be placed with some variation in their geometrical properties (height, length, shape, distance).

However, ordered structures need a process that for example uses some kind of lithography. Lithographic methods are generally feasible but expensive and are difficult to use on curved surfaces. Thus, in an alternative embodiment the nanostructures are instead randomly arranged on at least one of the first and the second side of the substrate, still giving good performance enhancements. In either case it may be desirable to arrange the nanostructures on not only one side of the substrate. Accordingly, in an embodiment the plurality of nanostructures are arranged on both sides of the substrate.

The light extraction structure according to embodiments of the invention may form part of a UV lamp, further comprising a UV light source, where the light extraction structure may be arranged as an envelope of the UV light source. In a possible embodiment, the UV lamp further comprises an electronic drive unit configured to operate the UV light source.

The UV light source may comprise at least one of a mercury (Hg) vapor based light source, a field emission based UV light source (FEL), a UVC Light Emitting Diode (LED), and an Excimer lamp.

It should be understood that the UV light source may comprise e.g. a plurality of LEDs and/or a combination of light sources based on different technologies to suit the application. That is, emerging technologies, such as field emission light sources (FEL) and UVC Light Emitting Diodes (LEDs), offer turn on times that are in the order of milliseconds, mainly governed by the electronic drive unit. UVC-LEDs are currently being developed, but are at this time exhibiting reportedly very short life times and very low energy efficiencies. Significant efforts are being used in order to improve this and will surely and eventually be successful. Field emission light sources may have life times in the order of 1000-6000 hours depending on the desired power density and have been measured to reach efficiencies around 10%, albeit currently around 6% in the UVC region.

Further features of, and advantages with, the present invention will become apparent when studying the appended claims and the following description. The skilled addressee realize that different features of the present invention may be combined to create embodiments other than those described in the following, without departing from the scope of the present invention.

BRIEF DESCRIPTION OF THE DRAWINGS

The various aspects of the invention, including its particular features and advantages, will be readily understood from the following detailed description and the accompanying drawings, in which:

in FIG. 2a;

FIGS. 3a-b schematically illustrate a light extraction layer according to an embodiment of the invention;

DETAILED DESCRIPTION

Figure 1:
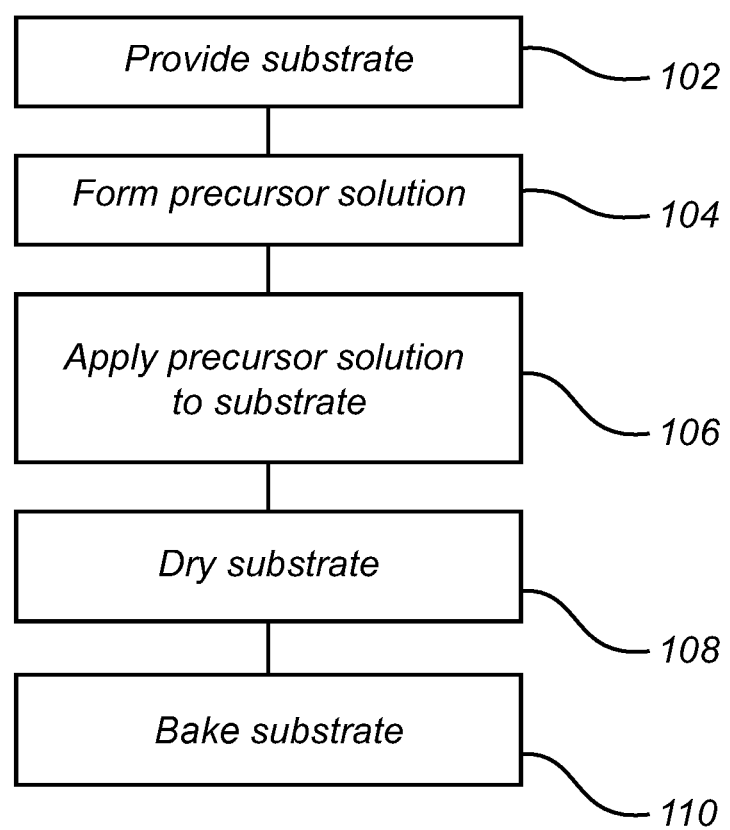
FIG. 1 is a flow chart outlining the general steps of a method according to an embodiment of the invention.

The present invention relates to a method for forming a light extraction layer including development of a non-aqueous sol-gel process, followed by application of the sol on a substrate and final heat treatment to fabricate a nanostructure light extraction layer. The overall process scheme will now be described more fully hereinafter with reference to the accompanying drawings, in which currently preferred embodiments of the invention are shown. The sol-gel process acts as precursor for the final nanostructure on the substrate and will be described in detail at the end of this chapter. This invention may be embodied in many different forms and should not be construed as limited to the embodiments set forth herein; rather, these embodiments are provided for thoroughness and completeness, and fully convey the scope of the invention to the skilled addressee. Like reference characters refer to like elements throughout.

Figure 3A:
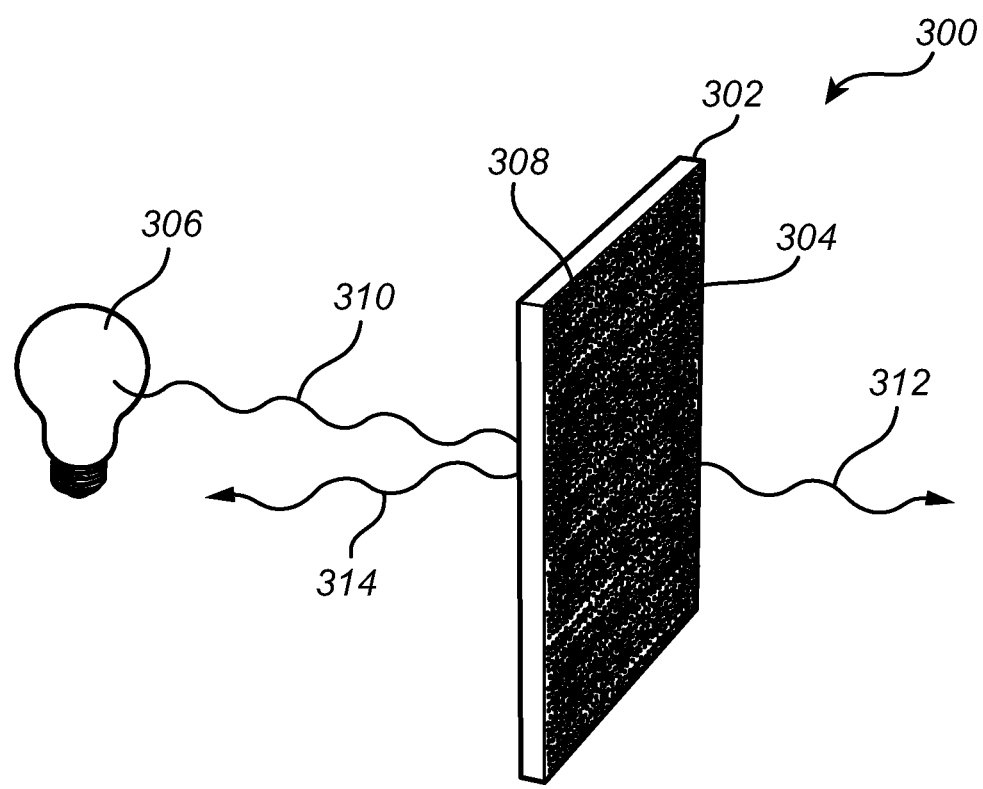
FIG. 3a disclose an exemplary extraction structure according to a currently preferred embodiment of the invention.

FIG. 1 schematically illustrates the general steps of a method for forming a light extraction layer according to an embodiment of the invention. The method will be discussed with reference FIG. 3a schematically illustrating a light extraction structure 300 comprising a flat substrate 302. A light extraction layer 308 comprising a large number of randomly placed nanostructures 304 is located on one side of the substrate 302. The light extraction layer comprises nanostructures formed using a sol-gel process.

In a first process step, a substrate 302 is provided 102, the substrate being at least partially transparent to UV light. The substrate is preferably selected to be formed from at least one of borosilicate glass, soda lime glass, sodium-barium-silicate glass, sapphire and quartz (e.g. including (crystalline $SiO_2$, silica, fused quartz). Other materials e.g. also the substrate being $MgF_2$ are also possible.

Next, a precursor solution comprising fluorine and an alkaline earth metal is formed 104 to produce alkaline earth metal difluoride particles in the solution. Details describing how the precursor solution is prepared will be outlined below.

Once the precursor solution has been properly prepared, it is applied 106 to at least a first side of the substrate 302. The precursor solution may be applied using for example, dip coating, spray coating or spin coating. For a flat substrate, spin coating or spray coating may be suitable, whereas for a substrate having a curved, tubular or irregular shape, dip coating may be preferable to ensure that a uniform light extraction layer may be formed.

After applying the precursor solution, the substrate is dried 108 at a first temperature for a first period of time, where the first temperature may be in the range of 50 to 150° C. and the first period of time may be in the range of 10 s to 5 min. The specific time and temperature may for example be selected based on the thickness of the applied precursor layer, and on the desired resulting properties of the nanostructures which depend on process times and temperatures.

Further parameters influencing the properties of the nanostructures are the method of coating and the number of light extraction layers. Moreover, if the precursor solution for example is applied by dip coating, the withdrawal speed from the precursor may typically be a few cm per second, and if multiple layers are applied the substrate may be dried for approximately 10 s between depositions of consecutive layers.

After deposition of the desired number of layers, the substrate is dried and baked, 110, i.e. treated at an elevated temperature, at a second temperature, higher than the first temperature, for a second period of time, to form a light extraction layer comprising alkaline earth metal difluoride nanostructures on the substrate. The second temperature may be in the range of 200 to 400° C. and the second period of time may be in the range of 1 min to 1 h. Accordingly, the alkaline earth metal difluoride nanostructures are formed from the precursor solution during the baking process.

With the above described process scheme, a light extraction layer comprising surface structures consisting of nanostructures of random orientation can be obtained.

Figure 2:
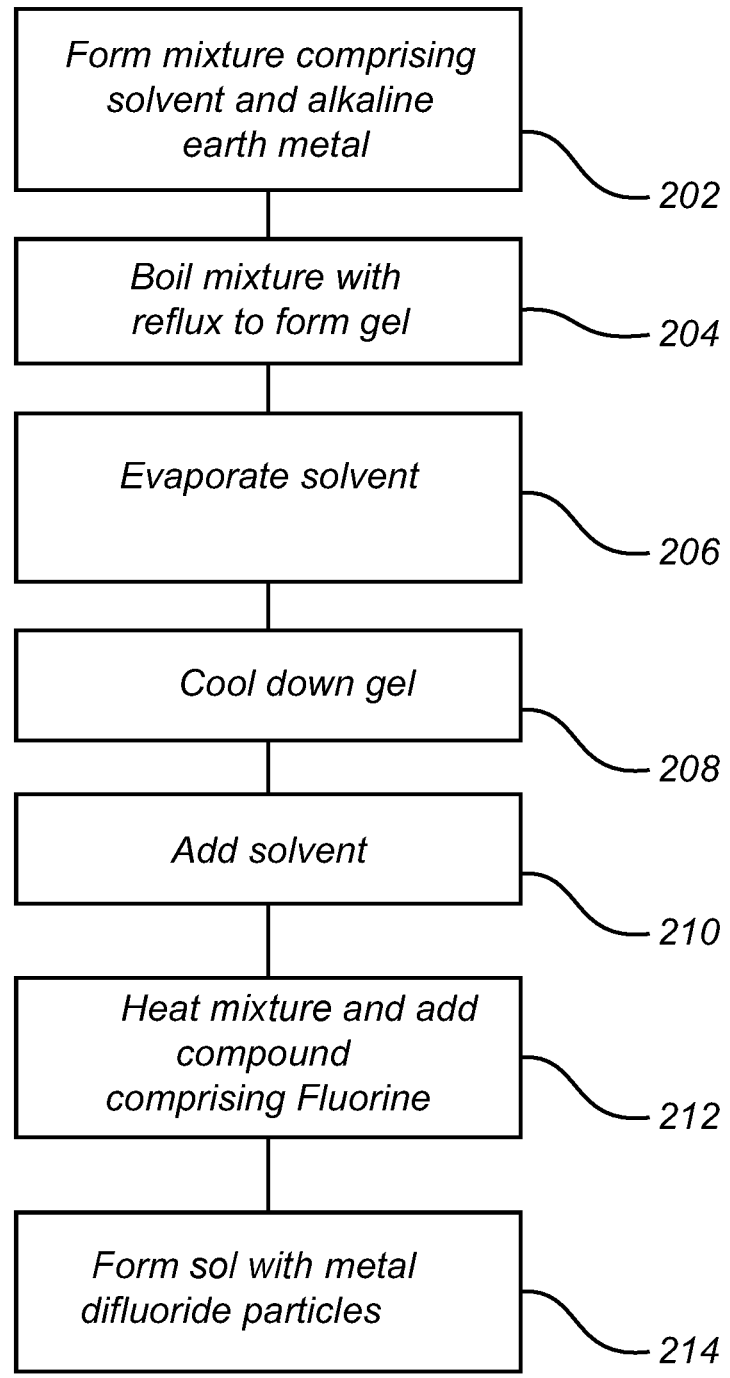
FIG. 2 is a flow chart outlining general method steps according to an embodiment of the invention.

The details relating to the formation of the precursor solution will now be discussed with reference to the flow chart of FIG. 2. Forming the precursor solution comprises forming 202 of a mixture comprising a solvent and an alkaline earth metal, which may be one of Mg, Ca, Sr and Ba, to form $MgF_2$, $CaF_2$, $SrF_2$ or $BaF_2$ nanostructures.

In the present example, Mg(Ac)2 with a small amount of water $((CH_3COO)_2 \cdot 4H_2O)$ and isopropyl alcohol were mixed. The mix is boiled 204 with reflux to form a gel by a reaction between the acetate and the alcohol. The gel formation occurs at the interface between undissolved Mg(Ac)2 particles and the solvent. The gel consists basically of a magnesium alkoxide with different ligands, acetate and isopropyl alcohol. Time for the gel formation, where the acetate ligands are substituted by isopropyl alcohol ligands, is in the range from 5 minutes to 1 hour.

After the gel formation the solvent is evaporated 206, the gel is cooled down 208 and an intermediate product is obtained. The chemical structure of the intermediate reaction product can be described as Magnesium acetoisopropoxide $[Mg(CH_3COO)n(^iPrO)_{5-n}]_2$, where the aceto-ligands form bridges and isopropyl alcohol become terminating ligands. A solvent, here in the form of Isopropyl alcohol, is then added 210 to the intermediate product and the resulting mixture is heated up 212 such that the gel starts to boil again for removal of trace amounts of water and for protection of additional gel formation of the intermediate product. Upon reaching the boiling point of the mixture, trifluoroacetic acid (TFA) is added. In this synthesis step, the isopropyl alcohol ligands are partly or completely replaced by fluorine ligands. After boiling with reflux for about an hour a transparent sol comprising metal fluoride nanoparticles $([MgF_n(O^iPr)_{5-n}]_2)$ is obtained 214 through formation of linked through F-ions magnesium alkoxide. In order to reduce access of water from the environment, cooling down to room temperature takes place under reflux. The sol is now ready to be used in a coating process, such as a dip coating process. The so obtained sol is stable for at least half a year.

Referring now to the drawings and to FIG. 3a in particular, there is illustrated an extraction structure 300 comprising a flat substrate 302, which may be the envelope of a lamp, a protective cover or a sleeve. A large number of randomly placed nanostructures 304 are applied to the opposite side of an omnidirectional light source 306 to form a light extraction layer 308. However, a light extraction layer may equally well be arranged on both sides of the substrate 302. When a light beam 310 reaches the surface of the substrate 302 it may be transmitted 312 through the substrate, or reflected 314 by the substrate as indicated in FIG. 3a.

The nanostructures should in general be separated from each other but may also form a continuous layer closest to the surface of the substrate or envelope surface. The average separation of nanostructures such as nanoparticles should be in the range of 1-100 nm. It should however be noted that, since the nanostructures are randomly placed, it is inevitable that some (or many) of the nanostructures will be attached to each other (i.e. not separated). Furthermore, the nanostructures may themselves be composed by even smaller substructures. The nanostructures may also be arranged to exhibit long- or short-range ordering.

Figure 3B:
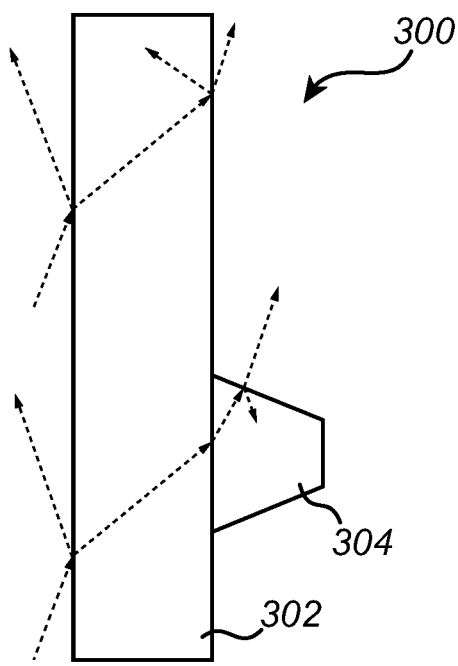
FIG. 3b shows an example of two different light paths, with and without a light extracting nanostructure, in cross section, as depicted e.g.

FIG. 3b shows a cross section of the flat substrate 101 and one single randomly placed nanostructure 102. The shape of the nanostructure is drawn schematically to facilitate the understanding, and also, as understood, FIG. 3b is not to scale. On the upper section of the substrate 302, light is incident on a glass substrate assumed to have a refractive index n=1.5, from air with a refractive index of n=1. Using conventional ray optics based on Snell's and Fresnel's equations, the transmission at this particular angle of incidence (70°, chosen arbitrarily to demonstrate the effect) is 69%—thus 31% is reflected or absorbed, i.e. lost.

In the lower section the same ray optics is used, but the light will exit through the nanostructure 304. The transmission in this case is calculated to 83%. In all this is 20% higher than in the case without the nanostructure. In order to get an overall improvement this behavior must be analyzed by integration of the two cases over the angle 0-90°. It should be noted that interference, phase shifts and so forth is not taken into account here, this example is to demonstrate the usefulness of a light extraction layer. In addition, nanostructures on both sides will further improve the transmission, as may also the above mentioned plasmonic and electromagnetic resonance effects.

There are several ways to implement the nanostructures. A tubular lamp envelope is used here as an example as those are commonly used but other forms are equally relevant. For example flat structures (e.g. as used in swimming pools) would be equally relevant.

Figure 4:
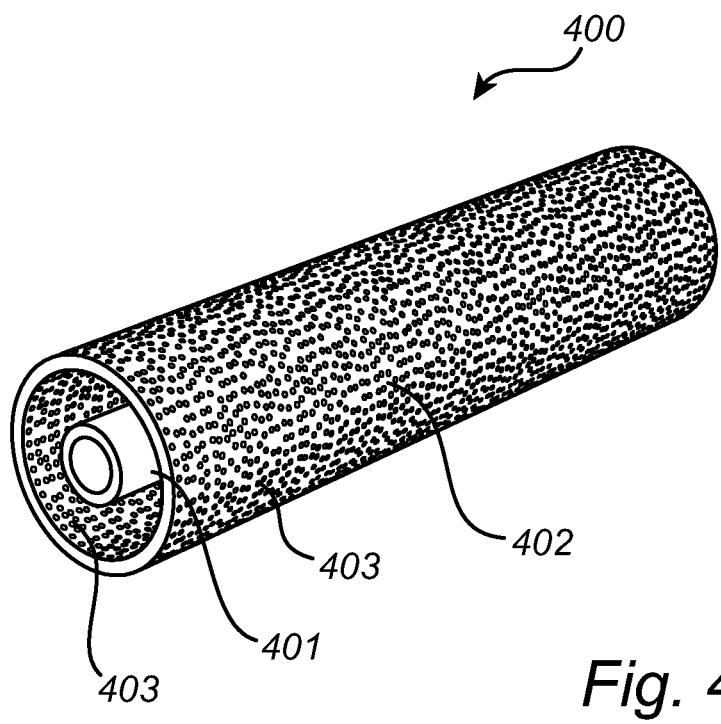
FIG. 4 shows a first exemplary embodiment of a light extraction structure for an UV lamp according to an embodiment of the invention.

In one embodiment of a UV lamp 400 illustrated in FIG. 4, the nanostructures 403 are placed on both sides of the surface of a tubular lamp envelope. The UV lamp 400 comprises a mercury based UV light source 401 which is protected by a sleeve 402, typically by quartz, which protects the surrounding media (water, air, etc.) should the lamp break, e.g. to prevent Hg to enter the surrounding media. In this case it is possible to place light extracting features, nanostructures 403, on the inside surface or the outside surface of the protective sleeve, or on both surfaces, depending on what the application requires.

Figure 5:
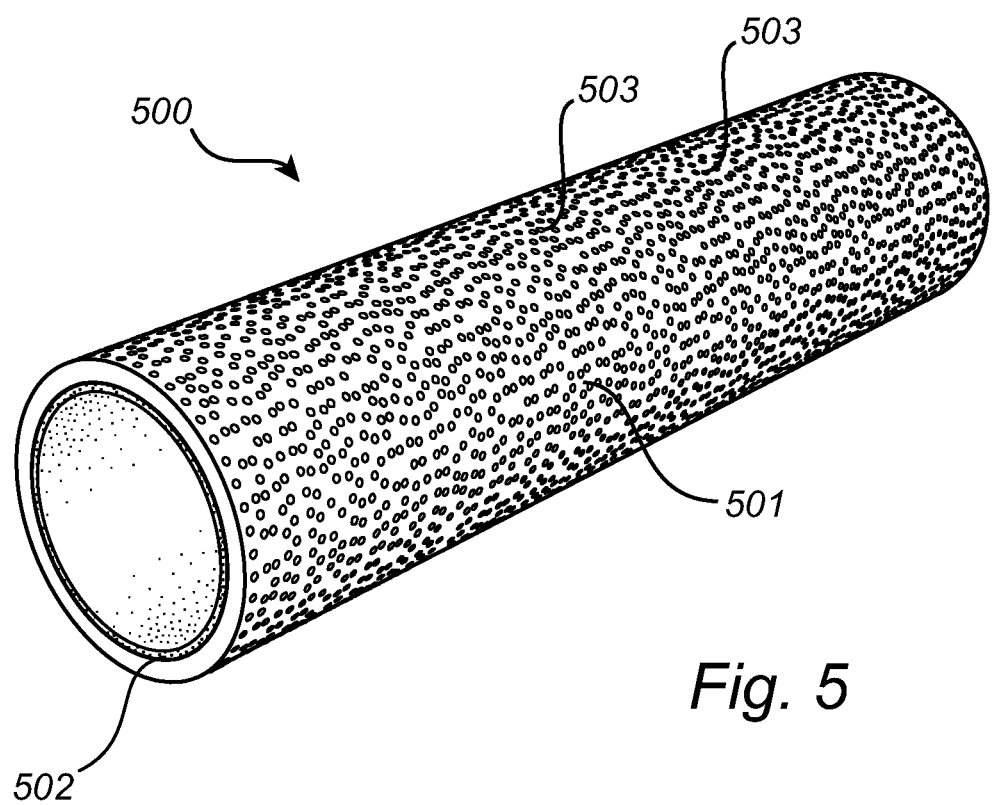
FIG. 5 shows a second exemplary embodiment of a light extraction structure for an UV lamp according to an embodiment of the invention.

In yet another implementation, as is shown in FIG. 5, the light is generated in a light powder, either by electron bombardment such as used in Field Emission Lamps or by a lower wavelength mercury plasma or in other ways (e.g. Excimer lamps or UVC-LEDs). The lamp 500 consists of an envelope 501 which is covered on the inside with a light generating material 502 usually referred to as a "phosphor" or a "light powder". Since this light generating material 502 in general has a higher refractive index as compared to the light extracting materials mentioned above, it is not advantageous to place the nanostructures between the light generating layer 502 and the lamp envelope 501. In this case the nanostructures 503 are advantageously placed on the outside of the lamp envelope as previously discussed. Obviously the nanostructures 503 may be adapted to the surfaces of any transparent cover to UV lamps in order to increase the UV output of such an arrangement.

In case of using a FEL light source, the FEL light source will comprise a (centrally arranged, not shown) field emission cathode and an electrically conductive anode structure, where the anode structure for example may be arranged adjacently to the light generating material 502. During operation, a power supply will be configured to apply a high voltage between the cathode and the anode such that electrons will be emitted from the cathode towards the anode. Once the electrons are received by the adjacently arranged light generating material 502, the light generating material 502 will emit photos, i.e. UV light.

By means of the invention, the efficiency of e.g. a resulting UV lamp comprising the extraction structure can be improved, using inexpensive and uncomplicated methods.

The UV lamp may further comprise a second light extraction structure arranged to enclose the first light extraction structure. The second light extraction structure, acting as a sleeve, may further improve light extraction properties of the lamp and also provides additional protection for the UV light source.

Although the figures may show a specific order of method steps, the order of the steps may differ from what is depicted. Also two or more steps may be performed concurrently or with partial concurrence. Additionally, even though the invention has been described with reference to specific exemplifying embodiments thereof, many different alterations, modifications and the like will become apparent for those skilled in the art. For example, it should be mentioned that light extraction in the visible region (400-800 nm) is also improved.

Variations to the disclosed embodiments can be understood and effected by the skilled addressee in practicing the claimed invention, from a study of the drawings, the disclosure, and the appended claims. Furthermore, in the claims, the word "comprising" does not exclude other elements or steps, and the indefinite article "a" or "an" does not exclude a plurality.

The invention claimed is:

1. A method for forming a light extraction layer comprising nanostructures, the method comprising:
providing a substrate, the substrate being at least partially transparent to ultraviolet ("UV") light;
forming a non-aqueous precursor solution comprising fluorine, a solvent, and an alkaline earth metal to form alkaline earth metal difluoride particles, wherein the non-aqueous precursor solution is formed in a two-step sol-gel process by first forming a gel, followed by providing the solvent to the gel;
applying the non-aqueous precursor solution on at least a first side of the substrate;
drying the substrate at a first temperature for a first period of time; and
baking the substrate at a second temperature, higher than the first temperature, for a second period of time, to form a light extraction layer comprising alkaline earth metal difluoride nanostructures on the substrate.

2. The method according to claim 1, wherein the nanostructures are nanograins.

3. The method according to claim 1, wherein the first temperature is in the range of 50 to 150° C. and the first period of time is in the range of 10 s to 5 min.

4. The method according to claim 1, wherein the second temperature is in the range of 200 to 400° C. and the second period of time is in the range of 1 min to 1 h.

5. The method according to claim 1, wherein forming the non-aqueous precursor solution comprises:
forming a mixture comprising the solvent and an alkaline earth metal;
boiling the mixture with reflux forming a gel;
evaporating the solvent of the gel;
cooling down the gel;
adding the solvent to the gel;
heating the solvent with gel;
when the boiling point of the solvent with gel is reached, adding a compound comprising fluorine; and
boiling the gel such that a transparent sol comprising alkaline earth metal difluoride particles is formed.

6. The method according to claim 5, wherein the step of boiling with reflux is performed for a time period in the range of 5 min to 1 h.

7. The method according to claim 5, wherein the compound comprising fluorine is Trifluoroacetic acid, $CF_3CO_2H$.

8. The method according to claim 1, wherein the nanostructures comprises at least one of $MgF_2$, $CaF_2$, $BaF_2$ and $SrF_2$.

9. The method according to claim 1, wherein applying the non-aqueous precursor solution on the substrate comprises, dip coating, spray coating or spin coating.

10. The method according to claim 1, wherein the substrate is a tubular structure, and wherein applying the treated non-aqueous precursor solution to the substrate comprises dip coating of the tubular structure to form a light extraction layer on the inside and outside of the tubular structure.

11. The method according to claim 1, wherein applying the non-aqueous precursor solution comprises applying a plurality of light extraction layers on the substrate.

12. The method according to claim 1, wherein a size of the nanostructures is in the range of 1 to 200 nm.

13. The method according to claim 1, wherein an average separation distance between nanostructures is in the range of 1 nm to 100 nm.

14. The method according to claim 1, wherein the plurality of nanostructures are grains arranged in a polycrystalline layer.

15. The method according to claim 1, wherein the plurality of nanostructures are at least partly transparent to the UV light.

16. The method according to claim 1, wherein the substrate comprises at least one of borosilicate glass, soda-lime glass, sapphire, $MgF_2$, and quartz.

17. A light extraction structure comprising a light extraction layer formed by the method according to claim 1, the light extraction structure comprising:
   a substrate at least partly transparent to UV light, the substrate having a first and a second side, the first side of the substrate arranged to face the UV light source and to receive UV light emitted by the UV light source; and
   a light extraction layer arranged on at least one of the first and the second side of the substrate, the light extraction layer being configured to reduce an amount of UV light reflected by the substrate.

18. A UV lamp, comprising:
   a UV light source, and
   a light extraction structure according to claim 17.

19. The UV lamp according to claim 18, wherein the light extraction structure is arranged as an envelope of the UV light source.

20. The UV lamp according to claim 18, further comprising a second light extraction structure arranged to enclose the first light extraction structure.

21. A method for forming a light extraction layer comprising nanostructures, the method comprising:
   providing a substrate, the substrate being at least partially transparent to ultraviolet ("UV") light;
   forming a non-aqueous precursor solution comprising fluorine and an alkaline earth metal to form alkaline earth metal difluoride particles, wherein forming the non-aqueous precursor solution comprises:
      forming a mixture comprising a solvent and an alkaline earth metal;
      boiling the mixture with reflux forming a gel,
      evaporating the solvent of the gel,
      cooling down the gel,
      adding the solvent to the gel,
      heating the solvent with gel,
      when the boiling point of the solvent with gel is reached, adding a compound comprising fluorine, and
      boiling the gel such that a transparent sol comprising alkaline earth metal difluoride particles is formed;
   applying the non-aqueous precursor solution on at least a first side of the substrate;
   drying the substrate at a first temperature for a first period of time; and
   baking the substrate at a second temperature, higher than the first temperature, for a second period of time, to form a light extraction layer comprising alkaline earth metal difluoride nanostructures on the substrate.

* * * * *